(12) United States Patent
Herberholz et al.

(10) Patent No.: US 8,658,524 B2
(45) Date of Patent: Feb. 25, 2014

(54) ON-GATE CONTACTS IN A MOS DEVICE

(75) Inventors: Rainer Herberholz, Cambridge (GB); David Vigar, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/515,758

(22) PCT Filed: Dec. 2, 2010

(86) PCT No.: PCT/GB2010/052012
§ 371 (c)(1),
(2), (4) Date: Jun. 13, 2012

(87) PCT Pub. No.: WO2011/073635
PCT Pub. Date: Jun. 23, 2011

(65) Prior Publication Data
US 2012/0248512 A1    Oct. 4, 2012

(30) Foreign Application Priority Data
Dec. 15, 2009    (GB) .................................. 0921844.7

(51) Int. Cl.
*H01L 21/3205*    (2006.01)

(52) U.S. Cl.
USPC ................... 438/587; 257/773; 257/E21.627; 438/666

(58) Field of Classification Search
USPC .......... 257/365, 773, E21.627; 438/587, 233, 438/586, 666
See application file for complete search history.

(56) References Cited

U.S. PATENT DOCUMENTS

| | | | |
|---|---|---|---|
| 5,034,792 A | 7/1991 | Kimura et al. | |
| 5,719,429 A | 2/1998 | Yoshida et al. | |
| 6,404,030 B1 | 6/2002 | Ma et al. | |
| 7,045,411 B1 * | 5/2006 | Lee | 438/218 |
| 7,989,868 B2 * | 8/2011 | Rieh et al. | 257/312 |

OTHER PUBLICATIONS

International Search Report mailed Apr. 1, 2011 for PCT Application No. PCT/GB2010/052012.

* cited by examiner

*Primary Examiner* — Quoc Hoang
(74) *Attorney, Agent, or Firm* — Frommer Lawrence & Haug LLP; Matthew M. Gaffney

(57) ABSTRACT

A MOS device, (400) comprising a semiconductor substrate comprising a channel, an electrode (402) insulated from the channel and positioned at least partly over the channel, and at least one contact (403) to the electrode, the at least one contact being positioned at least partly over the channel.

21 Claims, 4 Drawing Sheets

ON-GATE CONTACTS IN A MOS DEVICE

CROSS-REFERENCE TO RELATED APPLICATIONS

This patent application is a U.S. national phase of International Patent Application. No. PCT/GB2010/052012, filed on Dec. 2, 2010; the benefit of which is claimed and the contents of which are incorporated herein by reference in its entirety.

BACKGROUND

This invention relates to the provision of on-gate contacts for MOS components.

FIG. 1 shows a schematic diagram of a conventional MOS RF transistor 100 formed in a region 101 of a semiconductor substrate. The gate 102 extends across the width of a channel and the contacts 103 to the gate are located to one side of the region 101 over the thick (or field) oxide around the device. Source and drain contacts 104 are provided to the semiconductor substrate.

Conventional MOS transistor design forbids the placement of gate contacts over the channel as poor control of the etch process may consume a portion of the gate and in particular the highly conductive silicide top layer. This over-etching may expose the less conductive part of the gate to charging during the contact etch process leading to an increased electrical potential at the bottom of the contact, potentially causing local damage to the gate. Furthermore, as seen in FIG. 1, the contact size is generally larger than the drawn gate length, thereby preventing placement of contacts on the gate over the channel. All conventional MOS transistors therefore locate the gate contact away from the channel, over the thick field oxide where there will be no effect on the device.

As gate lengths decrease, the resistance of the gate increases and may affect the RF performance of the transistor. In particular, as the gate resistance increases, and the channel resistance decreases, the gate noise limits the noise figure of the device. It would therefore be desirable to decrease the sheet resistance of the gate electrode for new technology nodes. In practice however process integration choices may force the gate electrode to become significantly more resistive. As features sizes decrease, low-noise amplifiers can no longer be designed with sufficiently low noise figures using conventional layouts due to the increase in gate resistance.

The gate resistance is dependent, inter alia, on the effective width of the gate. FIG. 2 shows a MOS transistor 200 in which the gate 202 extends over the field oxide at both ends and a contact 203 is made at both of those ends.

The gate resistance can also be reduced by reducing the width of the channel and increasing the number of fingers. However, this leads to an increase in parasitic capacitance and area overhead.

FIG. 3 shows a further transistor layout 300 in which dual contacts 303 are located at each end of the gate 302 to reduce the contribution of the contacts to the overall resistance.

The ability to reduce the gate resistance is therefore limited by the topology of the devices, the effect of changes on other parameters, and material properties. There is therefore a requirement for a technique to reduce the gate resistance in MOS devices.

The embodiments described below are not limited to implementations which solve any or all of the disadvantages discussed above.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

There is provided a MOS device, comprising a semiconductor substrate comprising a channel, an electrode insulated from the channel and positioned at least partly over the channel, and at least one contact to the electrode, the at least one contact being positioned at least partly over the channel.

The device may be a transistor and the electrode is a gate of that transistor.

The device may be a varactor.

The at least one contact may be positioned entirely over the channel.

The MOS device may comprise a plurality of contacts to the electrode.

At least one of the contacts may be a slot contact. The slot contact may be connected to a metal interconnect layer only along part of the length of the contact.

The at least one contact may be offset laterally from source and drain contacts to the device.

The at least one contact may extend beyond the perimeter of the electrode.

There is also provided a design for a MOS device as described above.

There is also provided an integrated circuit comprising at least one MOS device as described above.

There is also provided a semiconductor wafer comprising at least one MOS device as described above.

There is also provided a method of designing a MOS device, comprising the steps of defining a channel in a semiconductor substrate, defining an electrode insulated from the channel and positioned at least partly over the channel, and defining at least one contact to the electrode, the at least one contact being positioned at least partly over the channel.

The method may further comprise the step of outputting data describing the designed MOS device to a data carrier for use in the control of the manufacture of the MOS device.

There is also provided a data carrier storing data representing a MOS device for use in the control of the manufacture of the MOS device, wherein the data represents a MOS device comprising a channel defined in a semiconductor substrate, an electrode insulated from the channel and positioned at least partly over the channel, and at least one contact to the electrode, the at least one contact being positioned at least partly over the channel.

There is also provided a method of manufacturing a MOS device, comprising the steps of forming a channel in a semiconductor substrate, forming an electrode insulated from the channel and positioned at least partly over the channel, and forming at least one contact to the electrode, the at least one contact being positioned at least partly over the channel.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
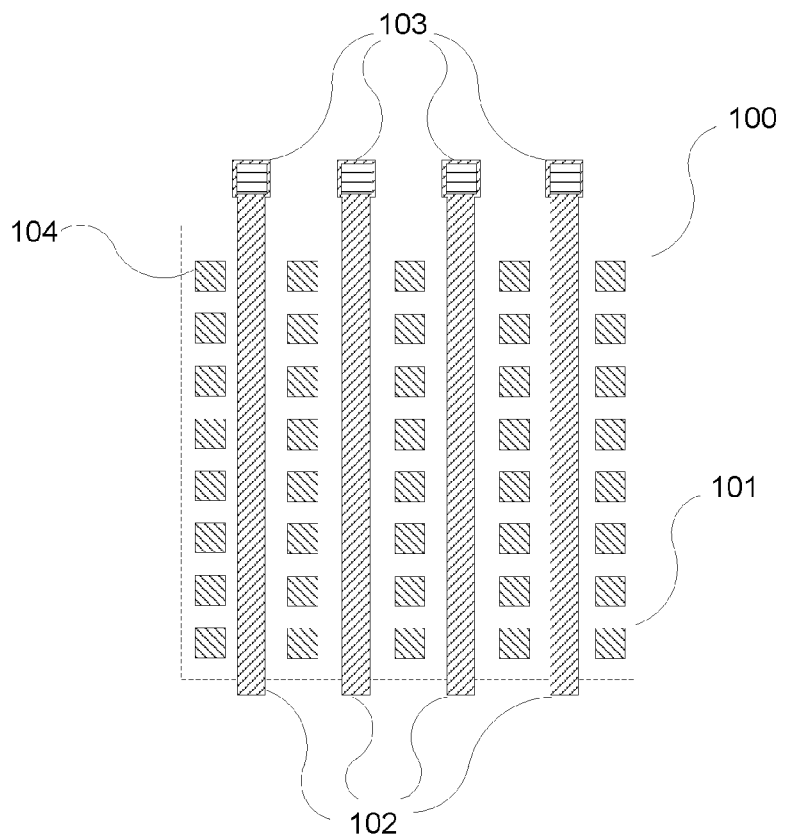
FIG. 1 shows a conventional layout for a MOSFET.
Figure 2:
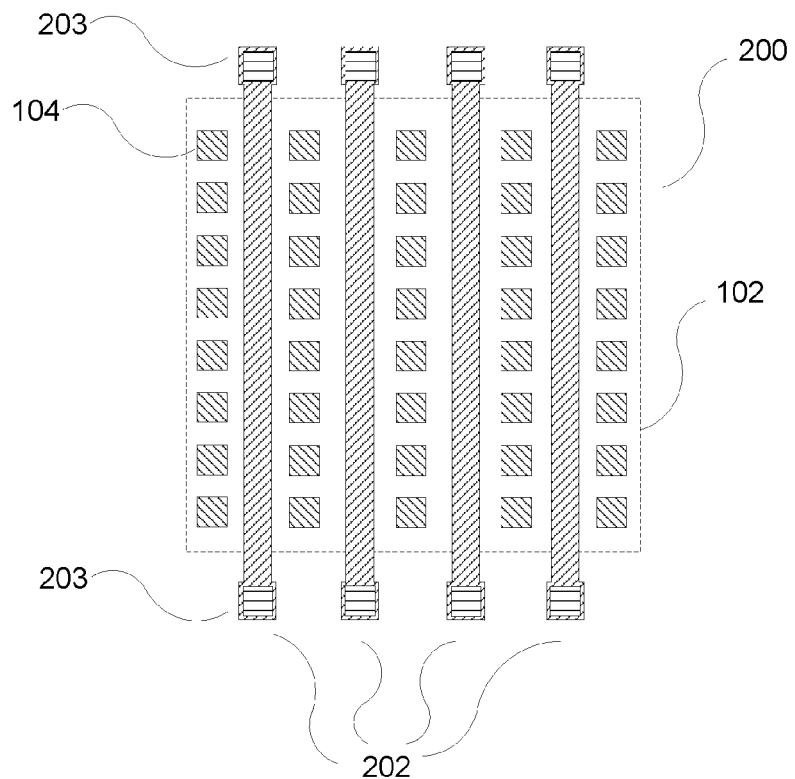
FIG. 2 shows a conventional layout for a MOSFET having contacts at both ends of the gate.
Figure 3:
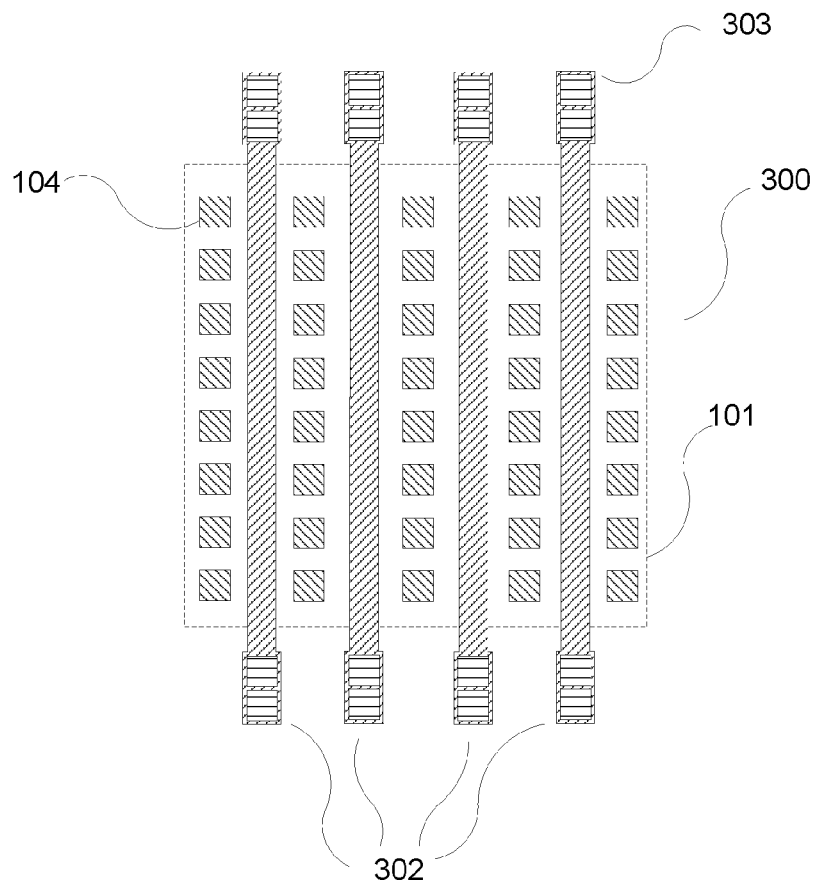
FIG. 3 shows a conventional layout for a MOSFET utilising double contacts.

Consistent reference numerals are used throughout the figures. Reference numerals may have been omitted from duplicate items for clarity.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

The effective resistance of the gate could be reduced by placing the gate contact over the channel, but conventional design rules prohibit such placement for the reasons described above.

Particular processing methods may allow the placement of gate contacts over the channel without incurring the problems described above. The use of etch-stop layers reduces over-etching of the gate contact hole into the gate, thereby reducing the charge build-up problem noted above. Also, the use of metals in place of Polycrystalline Silicon (PolySi) for gates provides a material with higher conductivity at the bottom of the gate, thereby reducing the risk of charging. These techniques, and others which provide greater control over the etching process, allow contacts to be placed over the channel of a MOS device.

Figure 4:
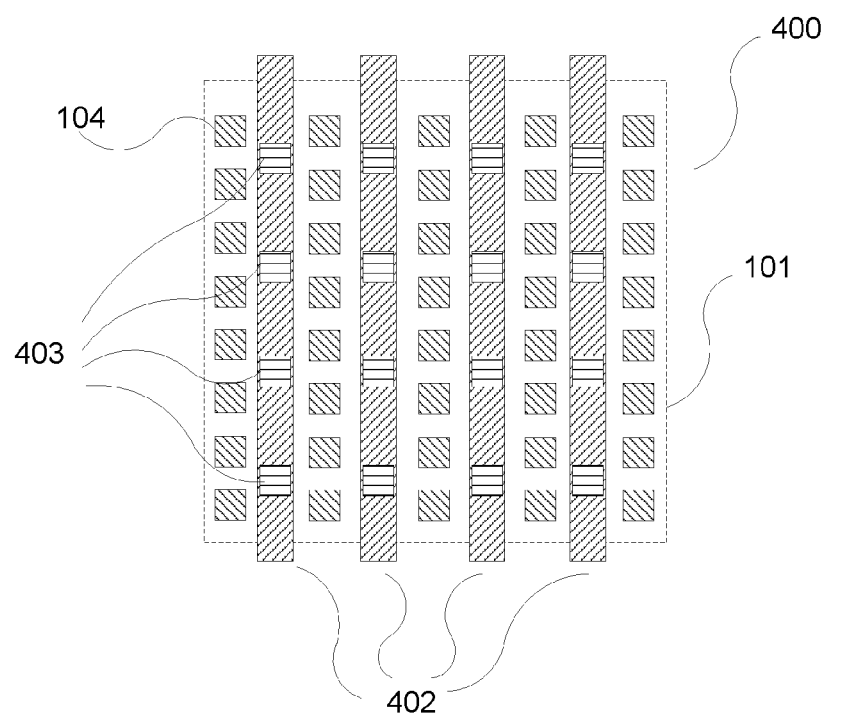
FIG. 4 shows a MOSFET layout utilising on-gate contacts.

FIG. 4 shows a transistor 400 layout using on-gate contacts. A conventional gate 402 is utilised over the channel, but it does not extend to contacts over the field oxide. Instead, contacts 403 are positioned at intervals along the width of the gate 402, over the channel. Conventional design rules and understanding forbid this placement, but as described above, controlled fabrication techniques allow the placement of contacts over the channel without harming the device.

The effective resistance of the gate 402 is dependent on the resistance of the gate material and the number and location of the contacts 403. The contact configuration is selected to provide the required performance for the particular device. The higher the number of contacts 403, the lower the resistance will be, but that increase also causes an increase in the capacitive load on the gate 402. Offsetting the gate contacts 403 from the Source and Drain contacts 104 reduces the increase in capacitance caused by the gate contacts 403 being located over the channel.

The layout of FIG. 4 is only appropriate where the drawn gate length is greater than the contact size, otherwise the contact will not fit on the gate. In many processes the contact size is larger than the minimum gate length, and therefore this layout may not be applicable to all gate lengths of a particular process. Some extension past the edge of the gate may be acceptable depending on the nature of the lateral insulation used between the gate and the active area as well as on the properties of the contact etch stop layer.

Figure 5:
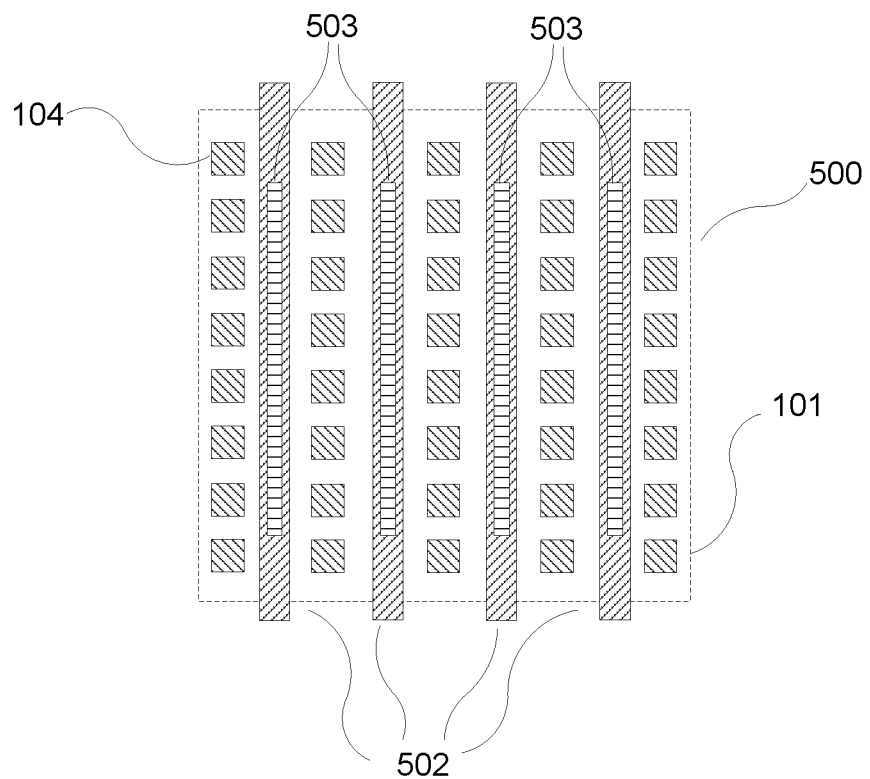
FIG. 5 shows a MOSFET layout utilising on-gate slot contacts.

FIG. 5 shows a variation of a MOS transistor 500 with on-gate contacts. The contact 503 to the gate 502 is a slot contact running along a substantial part of the width of the gate 502. The slot contact may reduce the effective resistance compared to a plurality of square contacts as shown in FIG. 4. Slot contacts may also allow a narrower contact than is possible with square contacts, thereby reducing the minimum gate length to which the layout can be applied. The slot contact may be provided as one continuous contact 503 as shown in FIG. 5, or may be split into more than one slot, for example to accommodate fabrication in particular MOS technologies.

Figure 6:
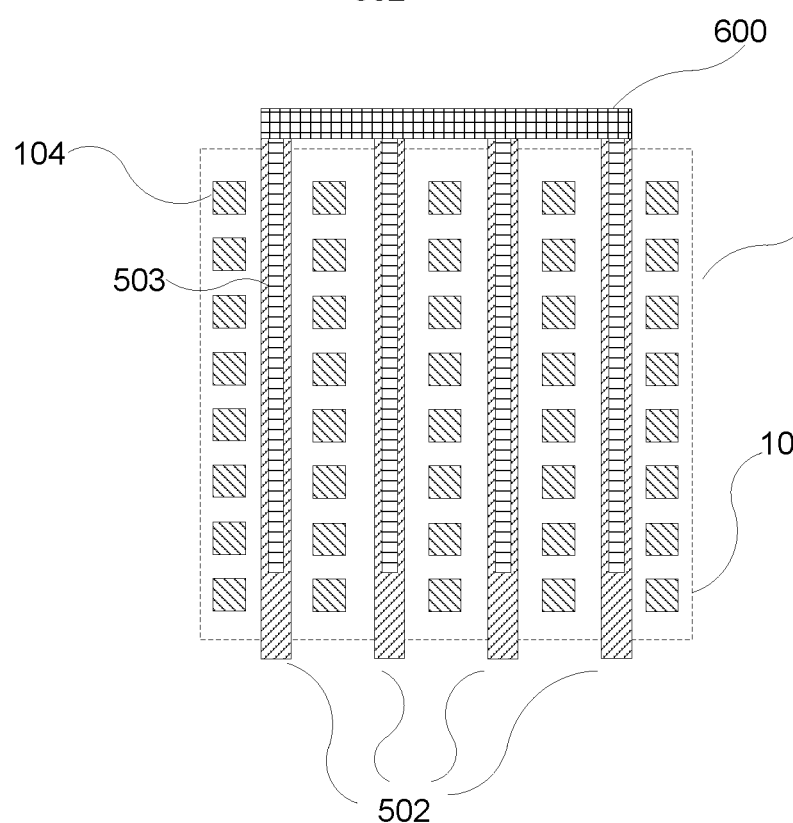
FIG. 6 shows a MOSFET layout utilising on-gate slot contacts and metal-layer interconnect.

The slot contacts 503 may be connected to the metal layer along their length or, as shown in FIG. 6, may act as a local interconnect and only connect to the metal layer 600 at particular locations intervals along their length. The total area of the contact on the gate must be limited according to the antenna rules to prevent harmful charging of the gate during processing.

Figure 7:
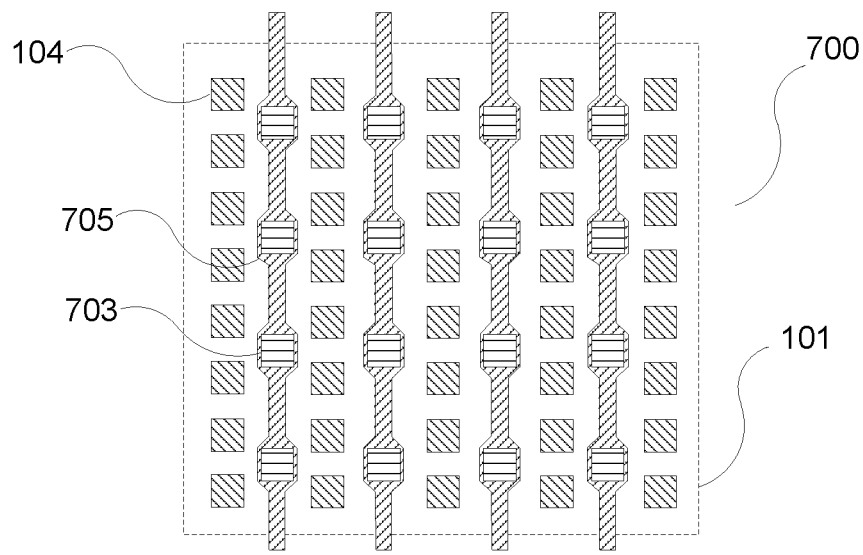
FIG. 7 shows a MOSFET utilising bent gates to reduce gate length.

The use of bends in a gate may allow the implementation of gate contacts over the channel for shorter gate lengths. FIG. 7 shows a layout 700 in which a shortened gate length is generally applied, but with local extensions 705 of that length to allow the landing of contacts 703 over the channel.

The layouts described above with gate contacts over the channel may also be applied to varactors. Since varactors generally utilise gate lengths of several times the minimum gate length, contacts over the channel may be more broadly applicable than for MOS transistors.

In addition to decreasing the effective resistance of the gate, the layouts discussed above also provide a more uniform access resistance across the width of the channel which may provide performance benefits at very high frequencies or under high transient stress (ESD).

Where the gate or contact are described as being over the channel, it will be understood that this means that the gate or contact fall within the perimeter of the channel when viewed in plan view, and not that the gate or contact are merely in a higher layer than the channel. Also, it is not intended to imply that there is any physical contact between the gate or contact and the channel.

Devices may be designed and fabricated according to the layouts described above utilising conventional techniques modified to allow the placement of contacts over a channel.

As will be appreciated, the layouts described herein are not restricted to any particular processing method, but are applicable in any processing method which can form the required contacts without the issues discussed above.

The transistor layouts of the figures are only provided as examples and are not restrictive of the on-gate principles described herein which are applicable to a broad range of device layouts.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term 'comprising' is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A MOS device, comprising
a semiconductor substrate comprising a channel,
an electrode insulated from the channel and positioned at least partly over the channel, and
a continuous contact to the electrode, the continuous contact being positioned at least partly over the channel and running along a substantial part of the width of the electrode.

2. A MOS device according to claim 1, wherein the device is a transistor and the electrode is a gate of that transistor.

3. A MOS device according to claim 1, wherein the continuous contact is positioned entirely over the channel.

4. A MOS device according to claim 1, wherein the continuous contact is a slot contact.

5. A MOS device according to claim 4, wherein the slot contact is connected to a metal interconnect layer only along part of the length of the contact.

6. A MOS device according to claim 1, wherein the continuous contact is offset laterally from source and drain contacts to the device.

7. A MOS device according to claim 1 wherein the continuous contact extends beyond the perimeter of the electrode.

8. An integrated circuit comprising at least one MOS device as claimed in claim 1.

9. A method of designing a MOS device, comprising the steps of
defining a channel in a semiconductor substrate,
defining an electrode insulated from the channel and positioned at least partly over the channel, and
defining a continuous contact to the electrode, the continuous contact being positioned at least partly over the channel and running along a substantial part of the width of the electrode.

10. A method according to claim 9, further comprising outputting data describing the designed MOS device to a data carrier for use in the control of the manufacture of the MOS device.

11. A data carrier storing data representing a MOS device for use in the control of the manufacture of the MOS device, wherein the data represents a MOS device comprising a channel in a semiconductor substrate, an electrode insulated from the channel and positioned at least partly over the channel, and a continuous contact to the electrode, the continuous contact being positioned at least partly over the channel and running along a substantial part of the width of the electrode.

12. A method of manufacturing a MOS device, comprising the steps of
forming an channel in a semiconductor substrate
forming an electrode insulated from the channel and positioned at least partly over the channel, and
forming a continuous contact to the electrode, the continuous contact being positioned at least partly over the channel and running along a substantial part of the width of the electrode.

13. A method of manufacturing a MOS device as claimed in claim 12, wherein the device is a transistor and the electrode is a gate of that transistor.

14. A method of manufacturing a MOS device as claimed in claim 12, wherein the device is a varactor.

15. A method of manufacturing a MOS device according to claim 12, wherein the continuous contact is positioned entirely over the channel.

16. A method of manufacturing a MOS device according to claim 12 wherein the device comprises a plurality of contacts to the electrode.

17. A method of manufacturing a MOS device according claim 12, wherein the continuous contact is a slot contact.

18. A method of manufacturing a MOS device according to claim 17, wherein the slot contact is connected to a metal interconnect layer only along part of the length of the contact.

19. A method of manufacturing a MOS device according to claim 12, wherein the continuous contact is offset laterally from source and drain contacts to the device.

20. A method of manufacturing a MOS device according to claim 12, wherein the continuous contact extends beyond the perimeter of the electrode.

21. A MOS device, comprising:
a semiconductor substrate comprising a channel;
an electrode insulated from the channel and positioned at least partly over the channel; and
at least one contact to the electrode, the at least one contact being positioned at least partly over the channel,
wherein the electrode is configured with local extensions that allow the landing of the at least one contact to the electrode.

* * * * *